(12) United States Patent
Sano

(10) Patent No.: US 6,195,297 B1
(45) Date of Patent: Feb. 27, 2001

(54) SEMICONDUCTOR MEMORY DEVICE HAVING PULL-DOWN FUNCTION FOR NON-SELECTED BIT LINES

(75) Inventor: Yuuichi Sano, Kumamoto (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/244,417

(22) Filed: Feb. 4, 1999

(30) Foreign Application Priority Data

Feb. 4, 1998 (JP) .................................................. 10-023647

(51) Int. Cl.$^7$ ....................................................... G11C 7/00
(52) U.S. Cl. .............................. 365/189.11; 365/185.25; 365/203
(58) Field of Search .......................... 365/189.11, 185.25, 365/203, 204, 207, 208

(56) References Cited

U.S. PATENT DOCUMENTS 5,835,432 * 11/1998 Nakano ................................ 365/205

FOREIGN PATENT DOCUMENTS

| 61-144793 | 7/1986 | (JP) . |
| 7-29373 | 1/1995 | (JP) . |
| 7-111085 | 4/1995 | (JP) . |
| 7-240093 | 9/1995 | (JP) . |
| 7-307091 | 11/1995 | (JP) . |

\* cited by examiner

*Primary Examiner*—A. Zarabian
(74) *Attorney, Agent, or Firm*—Sughrue, Mion, Zinn, Macpeak & Seas, PLLC (57) ABSTRACT

In a semiconductor memory device constructed a memory cell array including a plurality of read-only memory cells connected to a plurality of bit lines, a plurality of sense amplifiers each including a first MOS trnasistor connected to one of the bit lines, a reference voltage generating circuit for applying a reference voltage to a gate of the first MOS transistor, and a bit line selection circuit, for generating a plurality of bit line selection signals for selecting the bit lines respectively, a plurality of second MOS trnasistors, each of which is connected between one of the bit lines and the ground terminal, is provided. Also, a plurality of inverters, are connected between the bit line selection circuit and the second MOS transistors, so that the second MOS transistors are controlled by inverted signals of the bit line selection signals.

8 Claims, 7 Drawing Sheets

SEMICONDUCTOR MEMORY DEVICE HAVING PULL-DOWN FUNCTION FOR NON-SELECTED BIT LINES

BACKGROUND OF THE INVENTION

1. Field of the Invention

The present invention relates to a semiconductor memory device including read-only memory (ROM) cells, and more particularly to the improvement of the read operation speed thereof.

2. Description of the Related Art

A prior art semiconductor memory device is constructed by a memory cell array including a plurality of ROM cells connected to a plurality of bit lines, a plurality of sense amplifiers each including a MOS transistor connected to one of the bit lines, a reference volatage generating circuit for applying a reference voltage to a gate of the MOS transistor, and a bit line selection circuit for generating a plurality of bit line selection signals for selecting the respective bit lines.

In the above-described prior art ROM device, however, the reference voltage may be decreased due to the capacitive coupling of the gate and source (drain) of the MOS transistor. As a result, the speed of the read operation is decreased. This will be explained later in detail

SUMMARY OF THE INVENTION

It is an object of the present invention to suppress the reduction of the speed of the read operation of a semiconductor memory device including ROM cells.

According to the present invention, in a semiconductor memory device constructed by a memory cell array including a plurality of ROM cells connected to a plurality of bit lines, a plurality of sense amplifiers each including a first MOS transistor connected to one of the bit lines, a reference voltage generating circuit for applying a reference voltage to a gate of the first MOS transistor, and a bit line selection circuit for generating a plurality of bit line selection signals for selecting the bit lines respectively, a plurality of second MOS transistors, each of which is connected between one of the bit lines and the ground terminal, is provided. Also, a plurality of inverters are connected between the bit line selection circuit and the second MOS transistors, so that the second MOS transistors are controlled by inverted signals of the bit line selection signals.

Thus, only one selected bit line is precharged while the other non-selected bit lines are decreased to ground or remain at ground.

BRIEF DESCRIPTION OF THE DRAWINGS

The present invention will be more clearly understood from the description set forth below, as compared with the prior art, with reference to the accompanying drawings, wherein.

DESCRIPTION OF THE PREFERRED EMBODIMENTS

Before the description of the preferred embodiments, a prior art ROM device will be explained with reference to FIGS. 1 and 2.

In. FIG. 1, reference numeral 1 designates a memory cell array 2-1, 2-2 . . . designate sense amplifiers, and 3 designates a reference voltage generating circuit.

The memory cell array 1 is formed by nonvolatile memory cells $MC_{11}$, $MC_{12}$, . . . $MC_{21}$, $MC_{22}$, . . . , each having a source connected to the ground terminal GND, a drain connected to one of bit lines $BL_1$, $BL_2$, . . . , a floating gate, a control gate connected to one of word lines $WL_1$, $WL_2$, . . . . For example, a threshold voltage of one memory cell is 6V for data "0", and a threshold voltage of one memory cell is 2V for data "1".

One of X address signals X1, X2, . . . is made high by a row decoder DECX, and therefore, one of the word lines $WL_1$, $WL_2$, . . . , is selected. In this case, the voltage at a selected word line is 4V, and the voltage at non-selected word lines is 0V. Simultaneously, one of Y address signals Y1, Y2, . . . is made high by a column decoder DECY, and therefore, one of the bit lines $BL_1$, $BL_2$, . . . is selected by the sense amplifiers 2-1, 2-2, . . . . Thus, data is read from a selected memory cell.

The sense amplifier 2-1 (2-2, . . . ) is constructed by a NAND circuit 211 (221, . . . ) for receiving the Y address signal Y1 (Y2, . . . ) and a precharge signal PRC, a P-channel MOS transistor 212 (222, . . . ) having a source connected to a power supply terminal $V_{DD}$ and a gate connected to the output terminal of the NAND circuit 211 (221, . . . ), an N-channel MOS transistor 213 connected between the drain of the P-channel MOS transistor 212 (222, . . . ) and the bit line $BL_1$ ($BL_2$, . . . ), and an inverter 214 (224, . . . ) connected to the drains of the transistors 212 (222, . . . ) and 213 (223, . . . ) for generating a sense amplifier output signal $S_1$ ($S_2$, . . . ). Also, a reference voltage $V_{REF}$ is applied by the reference voltage generating circuit 3 to the gates of the transistors 213, 223, . . . . Note that the precharge signal PRC is generated from a control circuit CONT.

The reference voltage generating circuit 3 is constructed by a P-channel MOS transistor 301 having a grounded gate and two drain-gate-connected N-channel MOS transistors 302 and 303. In this case, the ON-resistance value of the P-channel MOS transistor 301 is sufficiently large. Also, if the threshold voltage $V_{thn}$ of the N-channel MOS transistors 302 and 303 is given by 0.7V, the reference voltage $V_{REF}$ is $$V_{REF}=2 \cdot V_{thn}=1.4\ V$$

Figure 1:
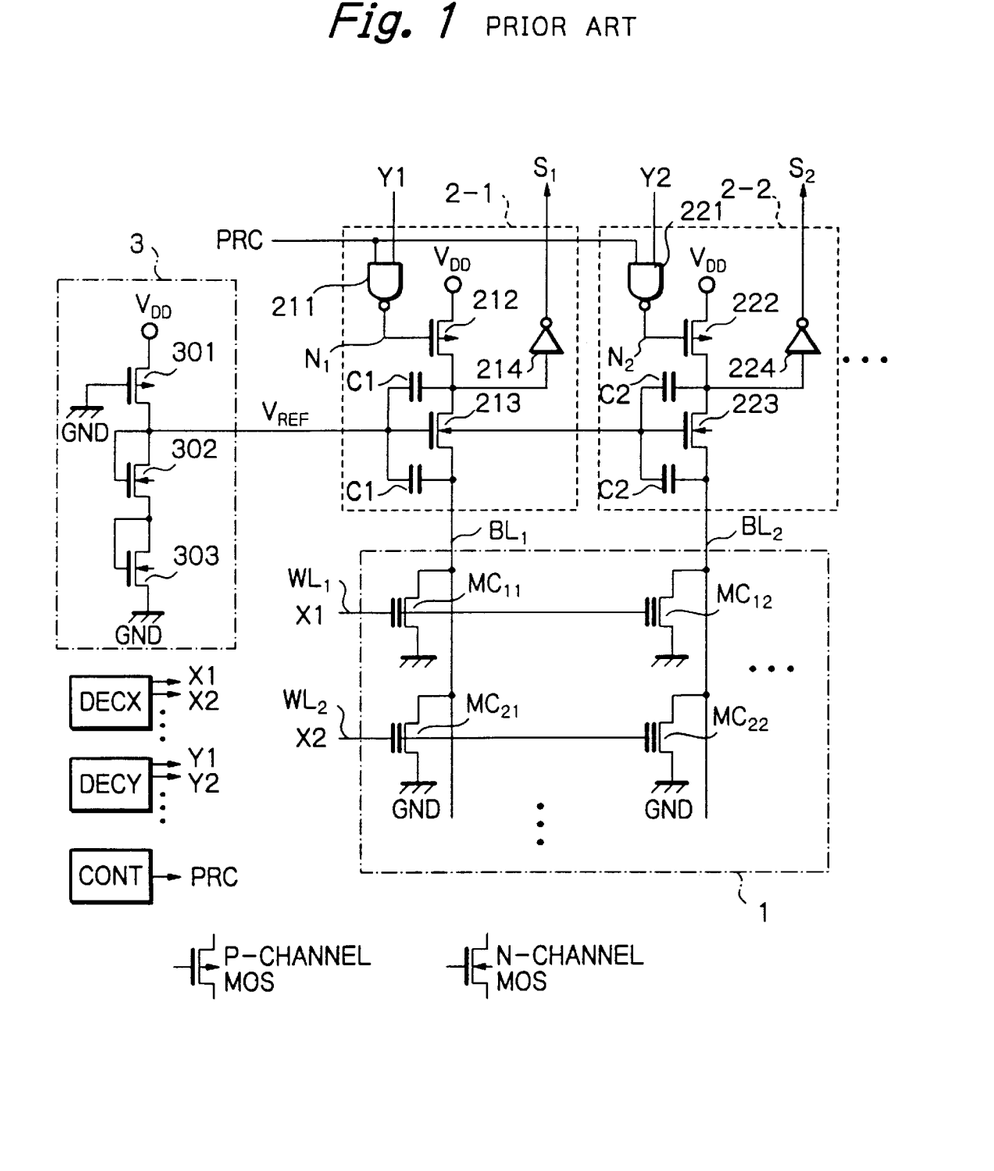
FIG. 1 is a circuit diagram illustrating a prior art ROM device.
Figure 2:
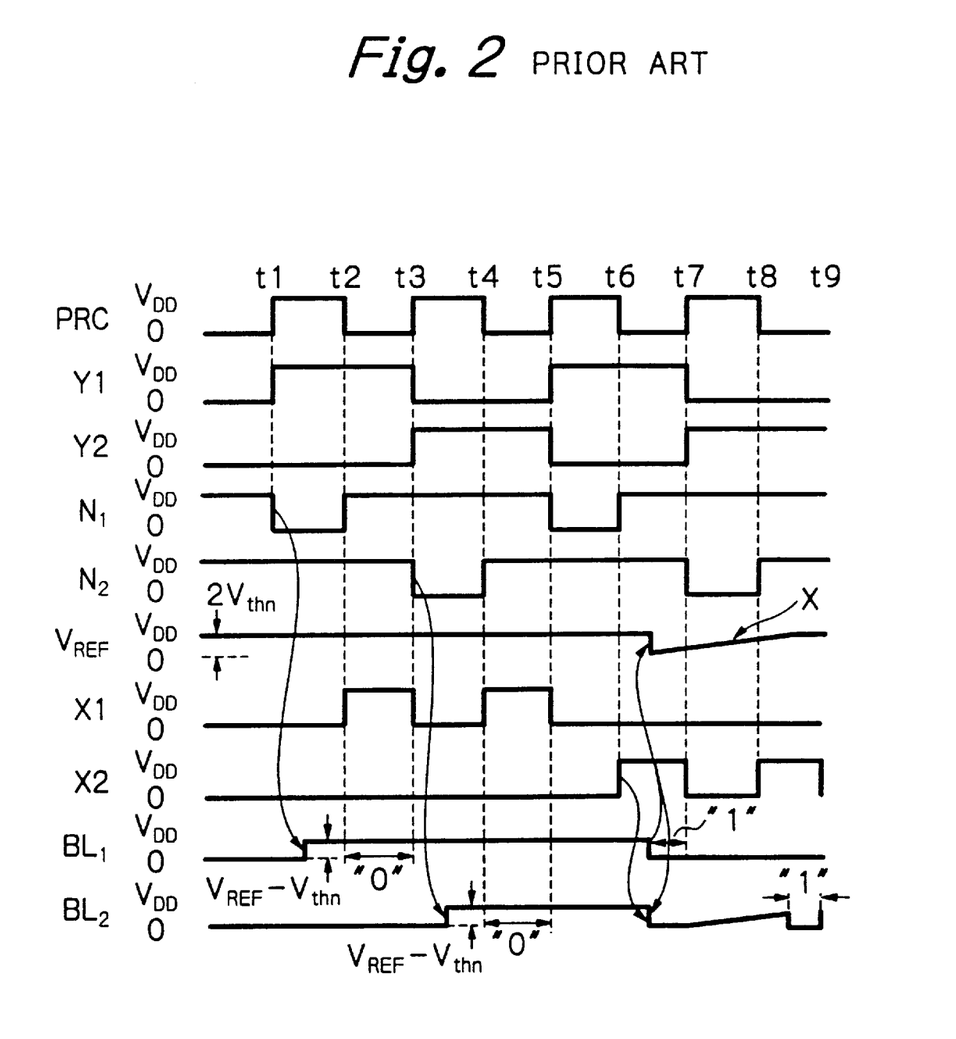
FIG. 2 is a timing diagram showing the operation of the device of FIG. 1.

The operation of the device of FIG. 1 is explained next with reference to FIG. 2. Here assume that the memory cells $MC_{11}$ and $MC_{12}$ store data "0", and the memory cells $MC_{21}$ and $MC_{22}$ store data "1".

A read operation for the memory cell $MC_{11}$ is carried out from time t1 to time t3.

First, at time t1, in order to perform a precharging operation upon the bit line $BL_1$, the precharge signal PRC is made high (=$V_{DD}$) and the Y address signals Y1 and Y2 are made high (=$V_{DD}$) and low (=GND), respectively. As a result, the voltage at the node $N_1$ of the NAND circuit 211 becomes low while the voltage at the node $N_2$ of the NAND circuit 221 remains high. Therefore, the transistors 212 and 222 are turned ON and OFF, respectively. Note that all the memory cells are turned OFF by the low X address signals X1 and X2. In this case, since the transistors 213 and 223 are in an ON state by the reference voltage $V_{REF}$ (=$2V_{thn}$), the bit line $BL_1$ is precharged to $V_{REF}-V_{thn}$, while the voltage at the bit line $BL_2$ remains low.

Next, at time t2, in order to preform a data sampling operation upon the memory cell $MC_{11}$, the X address signal X1 is made high to select the word line $WL_1$, while the X address signal X2 remains low. In this case, since the memory cell $MC_{11}$ stores data "0", the memory cell $MC_{11}$ remains in an OFF state, so that the voltages at the bit lines $BL_1$ and $BL_2$ remain high (=$V_{REF}-V_{thn}$) and low, respectively. As a result, the sense amplifier output signal $S_1$ shows low (=data "0").

A read operation for the memory cell $MC_{12}$ is carried out next from time t3 to time t5.

At time t3, in order to perform a precharging operation upon the bit line $BL_2$, the precharge signal PRC is made high (=$V_{DD}$) and the Y address signals Y1 and Y2 are made low (=GND) and high (=$V_{DD}$), respectively. As a result, the voltage at the node $N_2$ of the NAND circuit 221 becomes low while the voltage at the node $N_1$ of the NAND circuit 211 remains high. Therefore, the transistors 212 and 222 are turned OFF and ON, respectively. Note that all the memory cells are turned OFF by the low X address signals X1 and X2. In this case, since the transistors 213 and 223 are in an ON state by the reference voltage $V_{REF}$ (=$2V_{thn}$), the bit line $BL_2$ is precharged to $V_{REF}-V_{thn}$, while the voltage at the bit line $BL_1$ remains high (=$V_{REF}-V_{thn}$).

Next, at time t4, in order to perform a data sampling operation upon the memory cell $MC_{12}$, the X address signal X1 is made high to select the word line $WL_1$, while the X address signal X2 remains low. In this case, since the memory cell $MC_{12}$ stores data "0", the memory cell $MC_{12}$ remains in OFF state, so that the voltages at the bit lines $BL_1$ and $BL_2$ both remain high (=$V_{REF}-V_{thn}$). As a result, the sense amplifier output signal $S_2$ shows low (=data "0").

A read operation for the memory cell $MC_{21}$ is carried out next from time t5 to time t7.

At time t5, in order to perform a precharging operation upon the bit line $BL_1$, the precharge signal PRC is made high (=$V_{DD}$) and the Y address signals Y1 and Y2 are made high (=$V_{DD}$) and low (=GND), respectively. As a result, the voltage at the node $N_1$ of the NAND circuit 211 becomes low while the voltage at the node $N_2$ of the NAND circuit 221 remains high. Therefore, the transistors 212 and 222 are turned ON and OFF, respectively. Note that all the memory cells are turned OFF by the low X address signals X1 and X2. Also, the transistors 213 and 223 are in an ON state by the reference voltage $V_{REF}$ (=$2V_{thn}$). In this case, the voltages at the bit lines $BL_1$ and $BL_2$ both remain at $V_{REF}-V_{thn}$.

Next, at time t6, in order to perform a data sampling operation upon the memory cell $MC_{21}$, the X address signal X2 is made high to select the word line $WL_2$, while the X address signal X1 remains low. In this case, since the memory cell $MC_{21}$ stores data "1", the memory cell $MC_{21}$ is turned ON, so that the voltage at the bit line $BL_1$ becomes low. As a result, the sense amplifier output signal $S_1$ shows high (=data "1").

In the above-mentioned state, since the memory cell $MC_{22}$ also stores data "1", the memory cell $MC_{22}$ is also turned ON, so that the voltage at the bit line $BL_2$ also becomes low. That is, when the voltages at the bit lines $BL_1$ and $BL_2$ are simultaneously decreased, the reference voltage $V_{REF}$ is also decreased due to the capacitive coupling of the gate and source (drain) of each of the transistors 213 and 223 as indicated by C1 and C2 in FIG. 1.

Note that the greater the number of bit lines whose voltages are simultaneously decreased, the lower the reference voltage $V_{REF}$. When the reference voltage $V_{REF}$ is made lower, the reference voltage $V_{REF}$ is gradually increased as indicated in FIG. 2, since the ON-resistance of the transistor 301 is relatively large.

A read operation for the memory cell $MC_{22}$ is carried out next from time t7 to time t9.

At time t7, in order to perform a precharging operation upon the bit line $BL_2$, the precharge signal PRC is made high (=$V_{DD}$) and the Y address signals Y1 and Y2 are made low (=GND) and high (=$V_{DD}$), respectively. As a result, the voltage at the node $N_2$ of the NAND circuit 221 becomes low while the voltage at the node $N_1$ of the NAND circuit 211 remains high. Therefore, the transistors 212 and 222 are turned OFF and ON, respectively. Note that all the memory cells are turned OFF by the low X address signals X1 and X2. In this case, since the transistors 213 and 223 are in an incomplete ON state by the low reference voltage $V_{REF}$, the bit line $BL_2$ is gradually precharged to $V_{REF}-V_{thn}$, while the voltage at the bit line $BL_1$ remains low.

Next, at time t8, in order to perform a data sampling operation upon the memory cell $MC_{22}$, the X address signal X2 is made high to select the word line $WL_2$, while the X address signal X1 remains low. In this case, since the memory cell $MC_{22}$ stores data "1", the memory cell $MC_{22}$ is turned ON, so that the voltage at the bit lines $BL_2$ becomes low. As a result, the sense amplifier output signal $S_2$ shows high (=data "1").

In the above-mentioned state where the reference voltage $V_{REF}$ is lower than $2 \cdot V_{thn}$, if a memory cell storing data "1" needs to be read, the speed of the read operation for such a memory cell is decreased, since the ON resistance of the transistor 213 (223) is high so that the voltage at the precharged input of the inveter 214 (224) is hard to fall.

Thus, in the device of FIG. 1, the reference voltage $V_{REF}$ is made lower to decrease the speed of the read operation.

Figure 3:
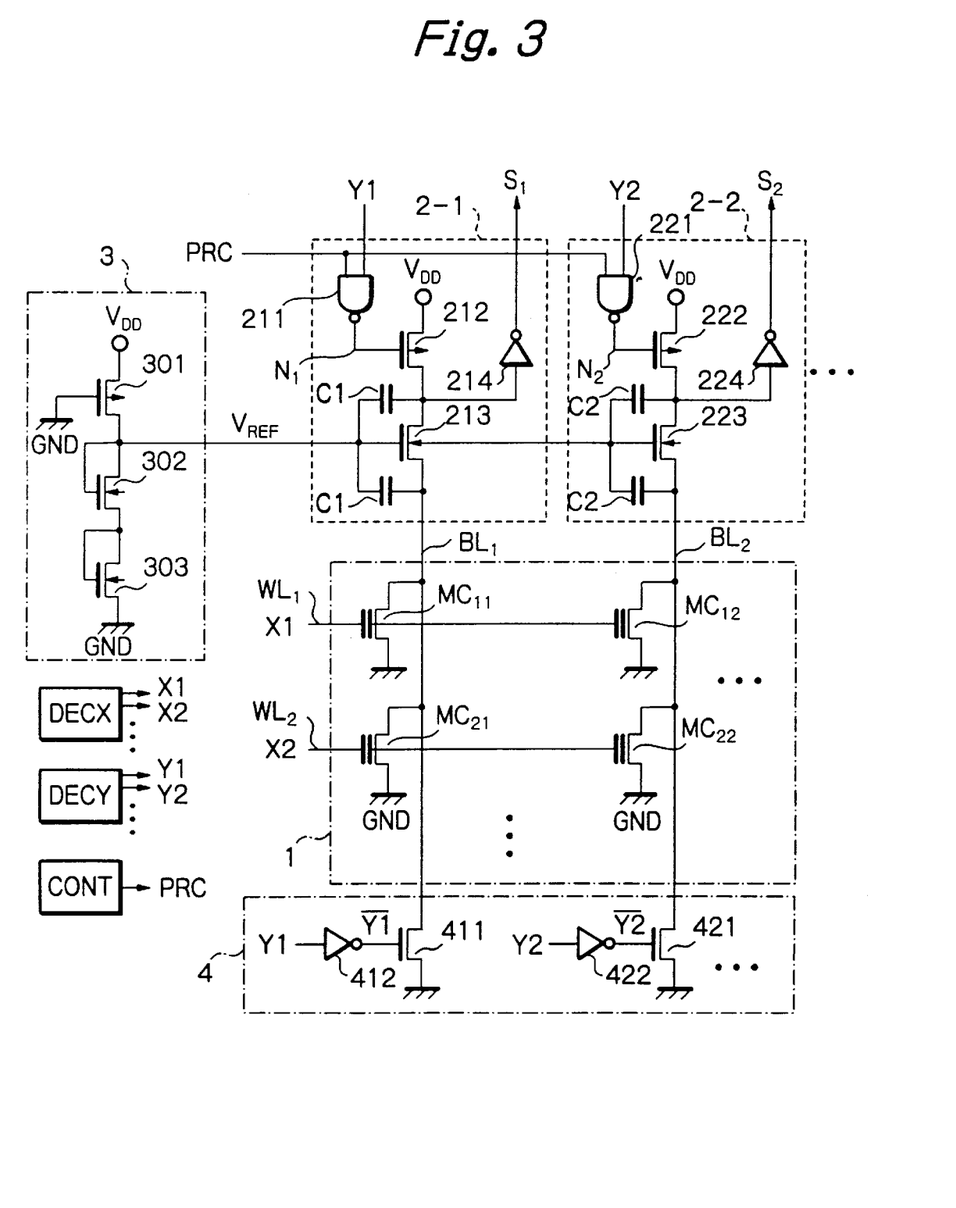
FIG. 3 is a circuit diagram illustrating a first embodiment of the ROM device according to the present invention.

In FIG. 3, which illustrates a first embodiment of the present invention, a pull down circuit 4 is added to the elements of FIG. 1. That is, the pull down circuit 4 is constructed by N-channel MOS transistors 411, 421, . . . . Each of the transistors 411, 421, . . . has a drain connected to one of the bit lines $BL_1$, $BL_2$ . . . , a source connected to the ground terminal GND, and a gate for receiving one of the Y address signals Y1, Y2, . . . , via inverters one of 412, 422, . . . .

Figure 4:
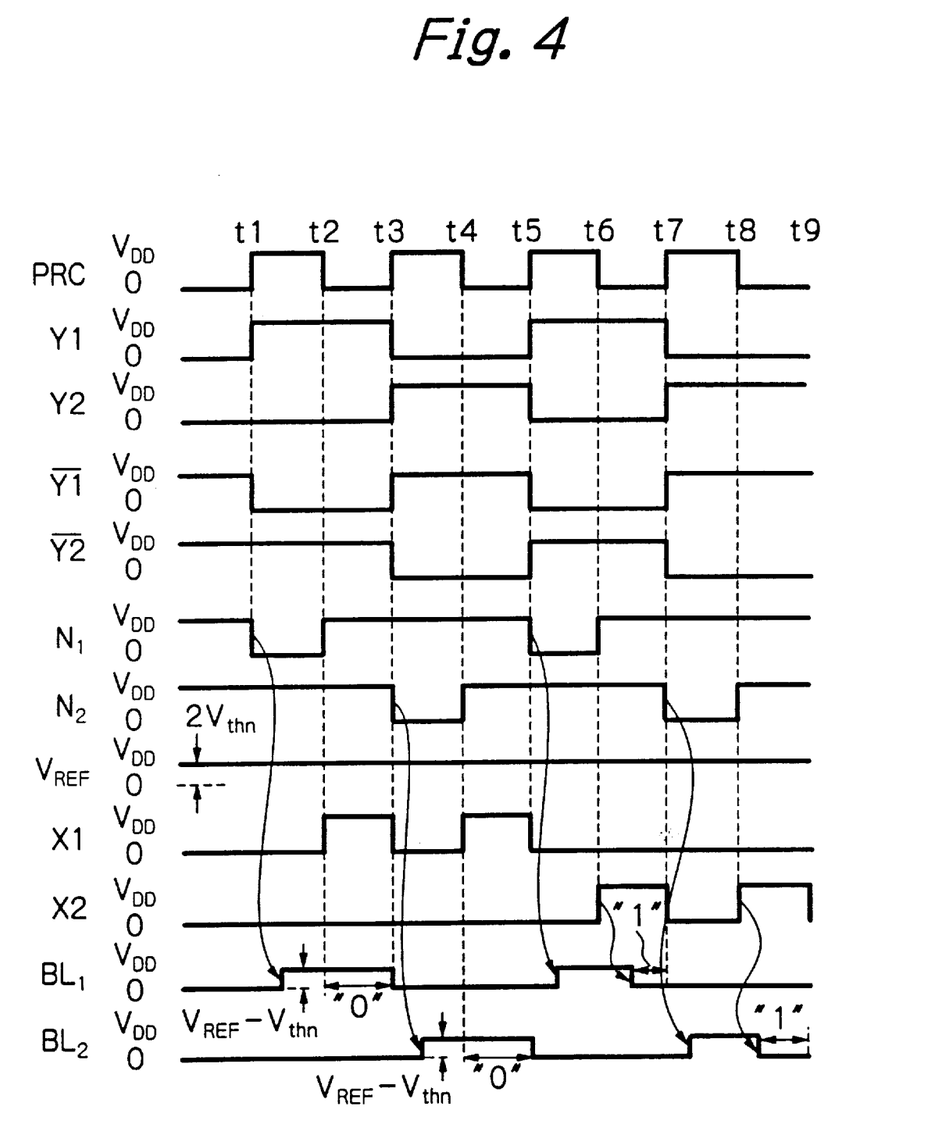
FIG. 4 is a timing diagram showing the operation of the device of FIG. 3.

The operation of the device of FIG. 3 is explained next with reference to FIG. 4. Here assume that the memory cells $MC_{11}$ and $MC_{12}$ store data "0", and the memory cells $MC_{21}$ and $MC_{22}$ store data "1".

A read operation for the memory cell $MC_{11}$ is carried out from time t1 to time t3.

First, at time t1, in order to perform a precharging operation upon the bit line $BL_1$, the precharge signal PRC is made high (=$V_{DD}$) and the Y address signals Y1 and Y2 are made high (=$V_{DD}$) and low (=GND), respectively. As a result, the voltage at the node $N_1$ of the NAND circuit 211 becomes low while the voltage at the node $N_2$ of the NAND circuit 221 remains high. Therefore, the transistors 212 and 222 are turned ON and OFF, respectively. Note that all the memory cells are turned OFF by the low X address signals X1 and X2. On the other hand, the signals $\overline{Y1}$ and $\overline{Y2}$ are made low and high, respectively, so that the transistors 411 and 421 are turned OFF and ON, respectively. In this case, since the transistors 213 and 223 are in an ON state by the reference voltage $V_{REF}$ (=$2V_{thn}$), the bit line $BL_1$ is precharged to $V_{REF}-V_{thn}$, while the voltage at the bit line $BL_2$ remains low.

Next, at time t2, in order to perform a data sampling operation upon the memory cell $MC_{11}$, the X address signal X1 is made high to select the word line $WL_1$, while the X address signal X2 remains low. In this case, since the memory cell $MC_{11}$ stores data "0", the memory cell $MC_{11}$ remains in on OFF state, so that the voltages at the bit lines $BL_1$ and $BL_2$ remain high (=$V_{REF}-V_{thn}$) and low, respectively. As a result, the sense amplifier output signal $S_1$ shows low (=data "0").

A read operation for the memory cell $MC_{12}$ is carried out next from time t3 to time t5.

At time t3, in order to perform a precharging operation upon the bit line $BL_2$, the precharge signal PRC is made high (=$V_{DD}$) and the Y address signals Y1 and Y2 are made low (=GND) and high (=$V_{DD}$), respectively. As a result, the voltage at the node $N_2$ of the NAND circuit 221 becomes low while the voltage at the node $N_1$ of the NAND circuit 211 remains high. Therefore, the transistors 212 and 222 are turned OFF and ON, respectively. Note that all the memory cells are turned OFF by the low X address signals X1 and X2. On the other hand, the signals $\overline{Y1}$ and $\overline{Y2}$ are made high and low, respectively, so that the transistors 411 and 421 are turned ON and OFF, respectively. In this case, since the transistors 213 and 223 are in an ON state by the reference voltage $V_{REF}$ (=$2V_{thn}$), the bit line $BL_2$ is precharged to $V_{REF}-V_{thn}$, while the voltage at the bit line $BL_1$ remains low.

Next, at time t4, in order to perform a data sampling operation upon the memory cell $MC_{12}$, the X address signal X1 is made high to select the word line $WL_1$, while the X address signal X2 remains low. In this case, since the memory cell $MC_{12}$ stores data "0", the memory cell $MC_{12}$ remains in an OFF state, so that the voltages at the bit lines $BL_1$ and $BL_2$ remain low and high (=$V_{REF}-V_{thn}$), respectively. As a result, the sense amplifier output signal $S_2$ shows low (=data "0").

A read operation for the memory cell $MC_{21}$ is carried out next from time t5 to time t7.

At time t5, in order to perform a precharging operation upon the bit line $BL_1$, the precharge signal PRC is made high (=$V_{DD}$) and the Y address signals Y1 and Y2 are made high (=$V_{DD}$) and low (=GND), respectively. As a result, the voltage at the node $N_1$ of the NAND circuit 211 becomes low while the voltage at the node $N_2$ of the NAND circuit 221 remains high. Therefore, the transistors 212 and 222 are turned ON and OFF, respectively. Note that all the memory cells are turned OFF by the low X address signals X1 and X2. On the other hand, the signals $\overline{Y1}$ and $\overline{Y2}$ are made low and high, respectively, so that the transistors 411 and 421 are turned OFF and ON, respectively. In this case, since the transistors 213 and 223 are in an ON state by the reference voltage $V_{REF}$ (=$2V_{thn}$), the bit line $BL_1$ is precharged to $V_{REF}-V_{thn}$, while the voltage at the bit line $BL_2$ remains low.

Next, at time t6, in order to perform a data sampling operation upon the memory cell $MC_{21}$, the X address signal X2 is made high to select the word line $WL_2$, while the X address signal X1 remains low. In this case, since the memory cell $MC_{21}$ stores data "1", the memory cell $MC_{21}$ is turned ON, so that the voltage at the bit line $BL_1$ becomes low. As a result, the sense amplifier output signal $S_1$ shows high (=data "1").

In the above-mentioned state, since the memory cell $MC_{22}$ also stores data "1", the memory cell $MC_{22}$ is also turned ON. In this case, however, the voltage at the bit line $BL_2$ already becomes low. Therefore, even when the voltage at the bit line $BL_1$ is decreased, the reference voltage $V_{REF}$ is not decreased due to the capacitive coupling of the gate and source (drain) of each the transistors 213 and 223.

A read operation for the memory cell $MC_{22}$ is carried out next from time t7 to time t9.

At time t7, in order to perform a precharging operation upon the bit line $BL_2$, the precharge signal PRC is made high (=$V_{DD}$) and the Y address signals Y1 and Y2 are made low (=GND) and high (=$V_{DD}$), respectively. As a result, the voltage at the node $N_2$ of the NAND circuit 221 becomes low while the voltage at the node $N_1$ of the NAND circuit 211 remains high. Therefore, the transistors 212 and 222 are turned OFF and ON, respectively. Note that all the memory cells are turned OFF by the low X address signals X1 and X2. On the other hand, the signals $\overline{Y1}$ and $\overline{Y2}$ are made high and low, respectively, so that the transistors 411 and 421 are turned ON and OFF, respectively. In this case, since the transistors 213 and 223 are in a ON state by the reference voltage $V_{REF}$ (=$2V_{thn}$), the bit line $BL_2$ is precharged to $V_{REF}-V_{thn}$, while the voltage at the bit line $BL_1$ remains low.

Next, at time t8, in order to perform a data sampling operation upon the memory cell $MC_{22}$, the X address signal X2 is made high to select the word line $WL_2$, while the X address signal X1 remains low. In this case, since the memory cell $MC_{22}$ stores data "1", the memory cell $MC_{22}$ is turned On, so that the voltage at the bit line $BL_2$ becomes low. As a result, the sense amplifier output signal $S_2$ shows high (=data "1").

In the above-described first embodiment, during a precharging time period, only one selected bit line is precharged while the voltages at non-selected bit lines remain low (=GND). As a result, even when the voltage at the selected bit line falls from high to low at the beginning of a data sampling time period, the reduction of the reference voltage $V_{REF}$ due to the capacitive coupling of the transistors 213, 223, . . . hardly occurs, since the voltages at all the other non-selected bit lines do not change. Thus, the reduction of the speed of the read operation can be suppressed.

Figure 5:
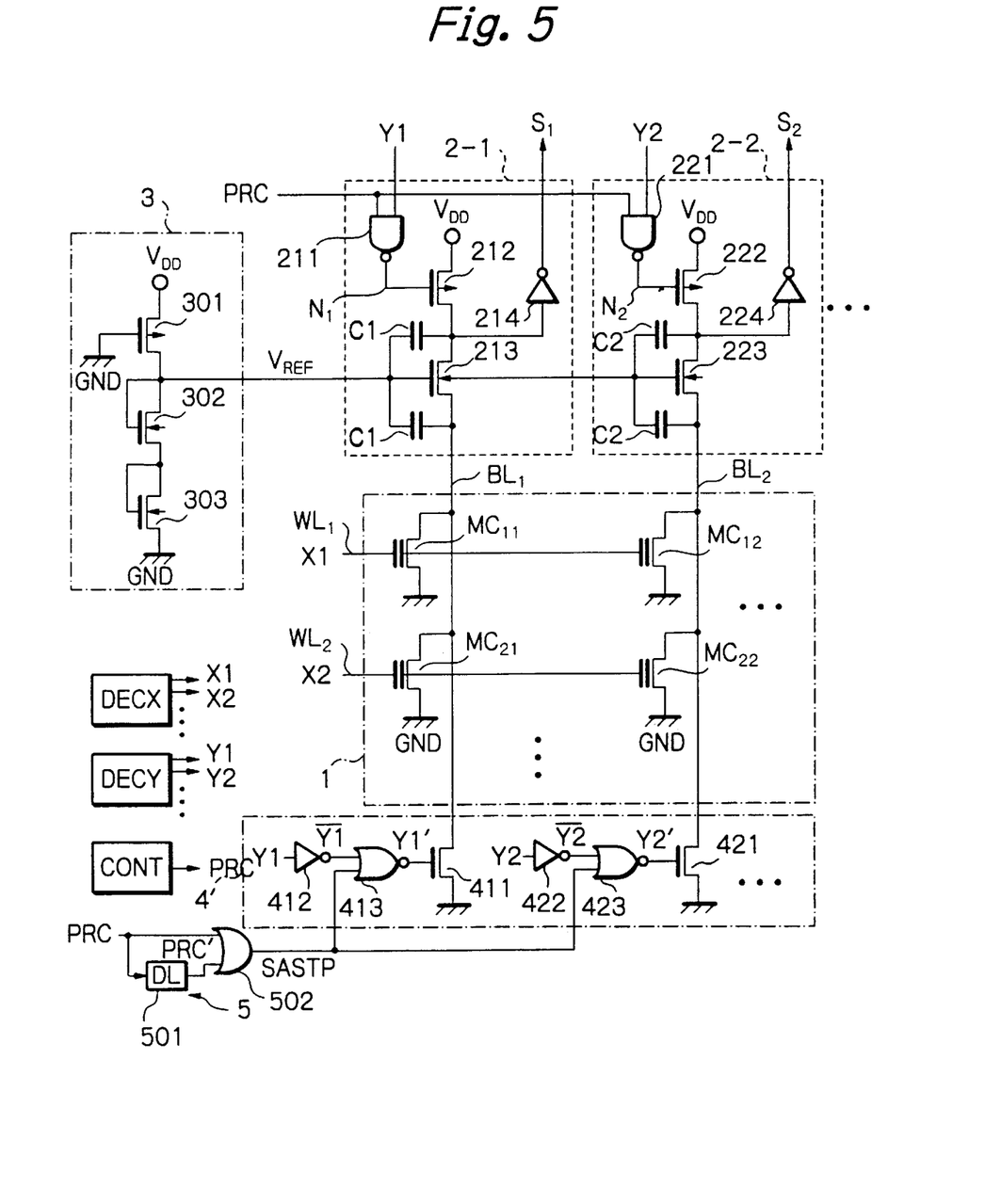
FIG. 5 is a circuit diagram illustrating a second embodiment of the ROM device according to the present invention.

In FIG. 5, which illustrates a second embodiment of the present invention, the pull-down circuit 4 is modified to a pull-down circuit 4' where NOR circuits 413, 423, . . . are added to receive a data sense recognition signal SASTP.

The data sense recognition signal SASTP is generated by a data sense recognition signal generating circuit 5 formed by a delay circuit 501 and an OR circuit 502. The delay circuit 501 has a long enough delay time τ to complete transmitssion of data from a selected memory cell to a corresponding bit line. In this case, the delay time τ is smaller than a data sampling time period. Also, the OR circuit 502 performs an OR logic operation upon the precharge signal PRC and a signal PRC' from the delay circuit 501 to generate the data sense recognition signal SASTP. Note that the data sense recognition signal SASTP serves to substantially stop a data sampling period.

The operation of the device of FIG. 5 is explained next with reference to FIG. 6. Here assume that the memory cells $MC_{11}$ and $MC_{12}$ store data "0", and the memory cells $MC_{21}$ and $MC_{22}$ store data "1".

Figure 6:
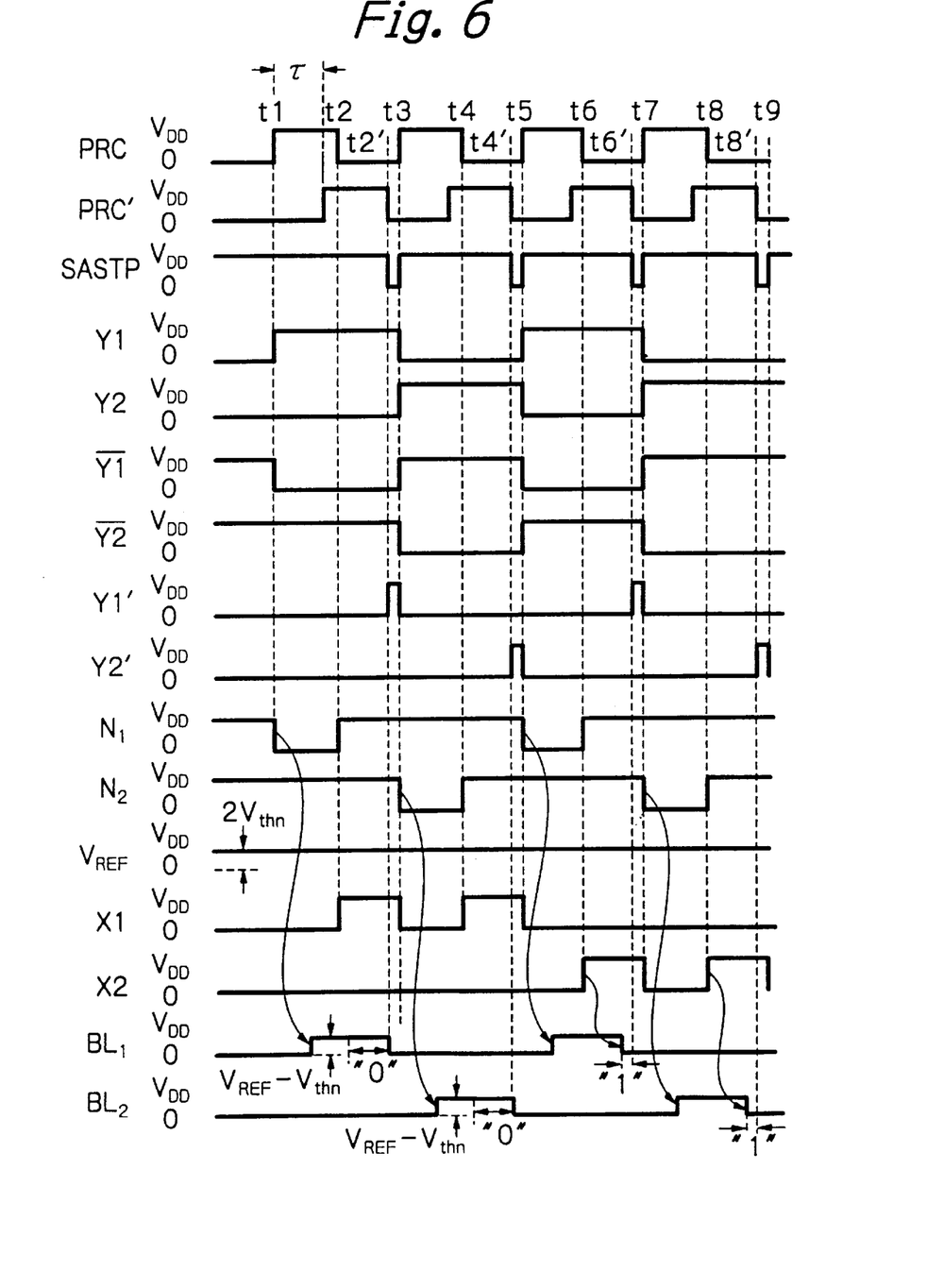
FIG. 6 is a timing diagram showing the operation of the device of FIG. 5.

As shown in FIG. 6, the delay circuit 501 delays the precharge signal PRC by the delay time τ to generate the signal PRC'. Also, the OR circuit 502 generates the data sense recognition signal SASTP which falls at times t2', t4', t6', t8', . . . and rises at times t3, t5, t7, t9, . . . .

A read operation for the memory cell $MC_{11}$ is carried out from time t1 to time t2'.

First, at time t1, in order to perform a precharging operation upon the bit line $BL_1$, the precharge signal PRC is made high ($=V_{DD}$) and the Y address signals Y1 and Y2 are made high ($=V_{DD}$) and low ($=$GND), respectively. As a result, the voltage at the node $N_1$ of the NAND circuit 211 becomes low while the voltage at the node $N_2$ of the NAND circuit 221 remains high. Therefore, the transistors 212 and 2Z2 are turned ON and OFF, respectively. Note that all the memory cells are turned OFF by the low X address signals X1 and X2. On the other hand, the signals $\overline{Y1}$ and $\overline{Y2}$ are made low and high, respectively; however, the data sense recognition signal SASTP is high, so that the transistors 411 and 421 are both turned OFF. In this case, since the transistors 213 and 223 are in an ON state by the reference voltage $V_{REF}$ ($=2\ V_{thn}$), the bit line $BL_1$ is precharged to $V_{REF}-V_{thn}$, while the voltage at the bit line $BL_2$ remains low.

Next, at time t2, in order to preform a data sampling operation upon the memory cell $MC_{11}$, the X address signal X1 is made high to select the word line $WL_1$, while the X address signal X2 remains low. In this case, since the memory cell $MC_{11}$ stores data "0", the memory cell $MC_{11}$ remains in an OFF state, so that the voltages at the bit lines $BL_1$ and $BL_2$ remain high ($=V_{REF}-V_{thn}$) and low, respectively. As a result, the sense amplifier output signal $S_1$ shows low ($=$data "0").

Next, at time t2', since the data sense recognition signal SASTP falls on the condition that the Y address signal Y1 is high, the signal Y1' of the NOR circuit 413 is made high so that the transistor 411 is turned ON to discharge the bit line $BL_1$. Thus, the data sampling period for the memory cell $MC_{11}$ is substantially completed before the next precharging period starts at time t3.

A read operation for the memory cell $MC_{12}$ is carried out next from time t3 to time t4'.

At time t3, in order to perform a precharging operation upon the bit line $BL_2$, the precharge signal PRC is made high ($=V_{DD}$) and the Y address signals Y1 and Y2 are made low ($=$GND) and high ($=V_{DD}$), respectively. As a result, the voltage at the node $N_2$ of the NAND circuit 221 becomes low while the voltage at the node $N_1$ of the NAND circuit 211 remains high. Therefore, the transistors 212 and 222 are turned OFF and ON, respectively. Note that all the memory cells are turned OFF by the low X address signals X1 and X2. On the other hand, the signals $\overline{Y1}$ and $\overline{Y2}$ are made high and low, respectively; however, the data sense recognition signal SASTP is high, so that the transistors 411 and 421 are both turned OFF. In this case, since the transistors 213 and 223 are in an ON state by the reference voltage $V_{REF}$ ($=2V_{thn}$), the bit line $BL_2$ is precharged to $V_{REF}-V_{thn}$, while the voltage at the bit line $BL_1$ remains low.

Next, at time t4, in order to perform a data sampling operation upon the memory cell $MC_{12}$, the X address signal X1 is made high to select the word line $WL_1$, while the X address signal X2 remains low. In this case, since the memory cell $MC_{12}$ stores data "0", the memory cell $MC_{12}$ remains in an OFF state, so that the voltages at the bit lines $BL_1$ and $BL_2$ remain low and high ($=V_{REF}-V_{thn}$), respectively. As a result, the sense amplifier output signal $S_2$ shows low ($=$data "0").

Next, at time t4', since the data sense recognition signal SASTP falls on the condition that the Y address signal Y2 is high, the signal Y2' of the NOR circuit 423 is made high so that the transistor 421 is turned ON to discharge the bit line $BL_2$. Thus, the data sampling period for the memory cell $MC_{12}$ is substantially completed before the next precharging period starts at time t5.

A read operation for the memory cell $MC_{21}$ is carried out next from time t5 to time t6'.

At time t5, in order to perform a precharging operation upon the bit line $BL_1$, the precharge signal PRC is made high ($=V_{DD}$) and the Y address signals Y1 and Y2 are made high ($=V_{DD}$) and low ($=$GND), respectively. As a result, the voltage at the node $N_1$ of the NAND circuit 211 becomes low while the voltage at the node $N_2$ of the NAND circuit 221 remains high. Therefore, the transistors 212 and 222 are turned ON and OFF, respectively. Note that all the memory cells are turned OFF by the low X address signals X1 and X2. On the other hand, the signals $\overline{Y1}$ and $\overline{Y2}$ are made low and high, respectively; however, the data sense recognition signal SASTP is high, so that the transistors 411 and 421 are both turned OFF. In this case, since the transistors 213 and 223 are in an ON state by the reference voltage $V_{REF}$ ($=2\ V_{thn}$), the bit line $BL_1$ is precharged to $V_{REF}-V_{thn}$, while the voltage at the bit line $BL_2$ remains low.

Next, at time t6, in order to perform a data sampling operation upon the memory cell $MC_{21}$, the X address signal X2 is made high to select the word line $WL_2$, while the X address signal X1 remains low. In this case, since the memory cell $MC_{21}$ stores data "1", the memory cell $MC_{21}$ is turned ON, so that the voltage at the bit line $BL_1$ becomes low. As a result, the sense amplifier output signal $S_1$ shows high ($=$data "1").

Next, at time t6', since the data sense recognition signal SASTP falls on the condition that the Y address signal Y2 is high, the signal Y2' of the NOR circuit 413 is made high so that the transistor 411 is turned ON to discharge the bit line $BL_1$. Thus, the data sampling period for the memory cell $MC_{21}$ is substantially completed before the next precharging period starts at time t7.

In the above-mentioned state, since the memory cell $MC_{22}$ also stores data "1", the memory cell $MC_{22}$ is also turned ON. In this case, however, the voltage at the bit line $BL_2$ already becomes low. Therefore, even when the voltage at the bit line $BL_1$ is decreased, the reference voltage $V_{REF}$ is not decreased due to the capacitive coupling of the gate and source (drain) of each the transistors 213 and 223.

A read operation for the memory cell $MC_{22}$ is carried out next from time t7 to time t8'.

At time t7, in order to perform a precharging operation upon the bit line $BL_2$, the precharge signal PRC is made high ($=V_{DD}$) and the Y address signals Y1 and Y2 are made low ($=$GND) and high ($=V_{DD}$), respectively. As a result the voltage at the node $N_2$ of the NAND circuit 221 becomes low while the voltage at the node $N_1$ of the NAND circuit 211 remains high. Therefore, the transistors 212 and 222 are turned OFF and ON, respectively. Note that all the memory cells are turned OFF by the low X address signals X1 and X2. On the other hand, the signals $\overline{Y1}$ and $\overline{Y2}$ are made high and low, respectively; however, the data sense recognition signal SASTP is high, so that the transistors 411 and 421 are both turned OFF. In this case, since the transistors 213 and 223 are in an ON state by the reference voltage $V_{REF}$ ($=2V_{thn}$), the bit line $BL_2$ is precharged to $V_{REF}-V_{thn}$, while the voltage at the bit line $BL_1$ remains low.

Next, at time t8, in order to perform a data sampling operation upon the memory cell $MC_{22}$, the X address signal X2 is made high to select the word line $WL_2$, while the X address signal X1 remains low. In this case, since the memory cell $MC_{22}$ stores data "1", the memory cell $MC_{22}$ is turned ON, so that the voltage at the bit line $BL_2$ becomes low. As a result, the sense amplifier output signal $S_2$ shows high ($=$data "1").

Next, at time t8', since the data sense recognition signal SASTP falls on the condition that the Y address signal Y2 is high, the signal Y2' of the NOR circuit 423 is made high so that the transistor 421 is turned ON to discharge the bit line $BL_2$. Thus, the data sampling period for the memory cell $MC_{22}$ is substantially completed before the next precharging period starts at time t9.

In the above-described second embodiment, during a precharging time period, only one selected bit line is precharged while the voltages at non-selected bit lines remains low (=GND). In addition, at the end of a data sampling time period before the next precharing time period starts, the voltage at the selected bit line becomes low. As a result, even when the voltage at the selected bit line falls from high to low at the beginning of a data sampling time period, the reduction of the reference voltage $V_{REF}$ due to the capacitive coupling of the transistors 213, 223, . . . hardly occurs, since the voltages at all the other non-selected bit lines do not change. Thus, the reduction of the speed of the read operation can be suppressed.

Figure 7A:
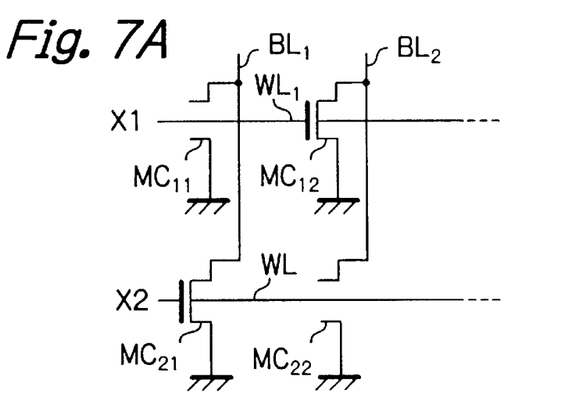
FIGS. 7A, 7B, 7C and 7D are circuit diagrams of modifications of the memory cell array of FIGS. 3 and 5.
Figure 7B:
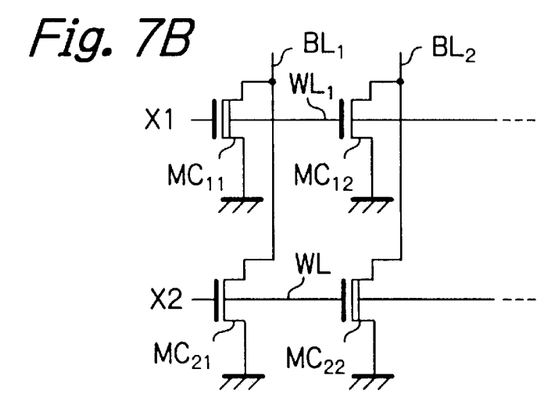
Figure 7C:
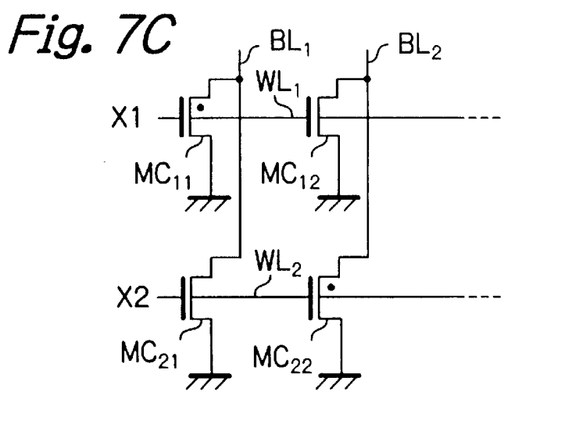
Figure 7D:
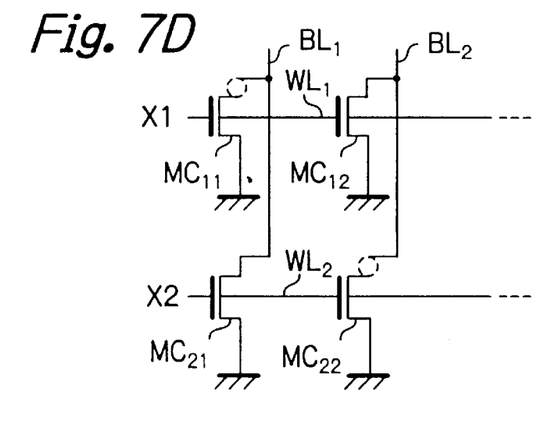

In FIGS. 3 and 5 the memory cell array 1 can be constructed by mask ROM cells. For example, as illustrated in FIG. 7A, data "0" or "1" of a memory cell corresponds to the presence or absence of an enhancement type transistor. Also, as illustrated in FIG. 7B, data "0" or "1" corresponds to the low or high threshold voltage of a transistor. Further, as illustrated in FIG. 7C, data "0" or "1" corresponds to the depletion type or enhancement type of a transistor. Further, as illustrated in FIG. 7D, data "0" or "1" corresponds to the presence or absence of a contact window (throughhole) which connects a transistor to one bit line.

As explained hereinbefore, according to the present invention, since the reference voltage supplied to the sense amplifiers is hardly decreased, the reduction of the speed of the read operation can be suppressed.

What is claimed is:

1. A semiconductor memory device comprising:

first and second power supply terminals;

a plurality of bit lines;

a memory cell array including a plurality of read-only memory cells connected to said bit lines;

a plurality of sense amplifiers connected to said first power supply terminal, each of said sense amplifiers including a first MOS transistor connected to one of said bit lines;

a reference voltage generating circuit for generating a reference voltage and applying said reference voltage to a gate of said first MOS transistor;

a bit line selection circuit, connected to said sense amplifiers, for generating a plurality of bit line selection signals for selecting said bit lines respectively;

a plurality of second MOS transistors, each connected between one of said bit lines and said second power supply terminal;

a plurality of inverters, each connected between said bit line selection circuit and one of said second MOS transistors, so that said second MOS transistors are controlled by inverted signals of said bit line selection signals;

a data sense recognition signal generating circuit for generating a data sense recognition signal; and a plurality of NOR circuits each, having a first input connected to one of said inverters, a second input connected to said data sense recognition signal generating circuit, and an output connected to one of said second MOS transistors.

2. The device as set forth in claim 1, further comprising:

a control circuit, connected to said sense amplifiers, for generating a precharge signal for precharging said bit lines;

a delay circuit, connected to said control circuit, for delaying said precharge signal; and an OR circuit, connected to said control circuit and said delay circuit, for generating said data sense recognition signal.

3. The device as set forth in claim 1, wherein said first and second MOS transistors are of an N-channel type.

4. The devoce as set forth in claim 1, wherein each of sense amplifiers comprises:

a NAND circuit, connected to said bit line selection circuit and said control circuit, for receiving one of said bit line selection signals and said precharge signal and generating an output signal;

a third MOS transistor, connected between said first power supply terminal and said first MOS transistor, said third MOS transistor being controlled by the output signal of said NAND circuit; and an inverter, connected to a node between said first and third MOS transistors, for generating a sense amplifier output signal.

5. The device as set forth in claim 4, wherein said third MOS transistor is of a P-channel type.

6. The device as set forth in claim 1, wherein said reference voltage generating circuit comprises:

a P-channel MOS transistor having a source connected to said first power supply terminal, a gate connected to said second power supply terminal, and a gate; and at least one N-channel MOS transistor having a source connected to said second power supply terminal and a drain connected to a gate of said N-channel MOS transistor, a node between said P-channel MOS transistor and said N-channel MOS transistor generating said reference voltage.

7. The device as set forth in claim 1, wherein said read-only memory cells are of a nonvolatile type.

8. The device as set forth in claim 1, wherein said read-only memory cells are of a mask ROM cell type.

* * * * *